(12) United States Patent
Gan

(10) Patent No.: US 9,355,712 B2
(45) Date of Patent: May 31, 2016

(54) ELECTROMECHANICAL NONVOLATILE MEMORY

(71) Applicant: SEMICONDUCTOR MANUFACTURING INTERNATIONAL (SHANGHAI) CORPORATION, Shanghai (CN)

(72) Inventor: Zhenghao Gan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/826,176

(22) Filed: Aug. 13, 2015

(65) Prior Publication Data

US 2016/0086660 A1    Mar. 24, 2016

(30) Foreign Application Priority Data

Sep. 22, 2014 (CN) .......................... 2014 1 0486979

(51) Int. Cl.
| | |
|---|---|
| *H01L 23/528* | (2006.01) |
| *G11C 11/50* | (2006.01) |
| *H01L 23/532* | (2006.01) |
| *H01L 29/49* | (2006.01) |
| *H01L 27/115* | (2006.01) |
| *H01L 21/28* | (2006.01) |
| *H01L 21/3213* | (2006.01) |
| *H01L 21/285* | (2006.01) |
| *H01L 21/02* | (2006.01) |

(52) U.S. Cl.
CPC ............ *G11C 11/50* (2013.01); *H01L 21/0217* (2013.01); *H01L 21/02274* (2013.01); *H01L 21/2855* (2013.01); *H01L 21/28088* (2013.01); *H01L 21/28556* (2013.01); *H01L 21/32134* (2013.01); *H01L 21/32136* (2013.01); *H01L 23/528* (2013.01); *H01L 23/53261* (2013.01); *H01L 27/115* (2013.01); *H01L 29/4966* (2013.01)

(58) Field of Classification Search
CPC ................ G11C 11/50; H01L 29/4966; H01L 21/32134; H01L 21/32136; H01L 21/02274; H01L 27/115; H01L 21/28556; H01L 23/528; H01L 21/0217; H01L 21/28088; H01L 21/2855; H01L 23/5326
USPC ......................................................... 257/254
See application file for complete search history.

(56) References Cited

U.S. PATENT DOCUMENTS

2015/0016185 A1*  1/2015  King Liu ............ H01L 27/1021
                                                                  365/175

* cited by examiner

*Primary Examiner* — Selim Ahmed
(74) *Attorney, Agent, or Firm* — Kilpatrick Townsend & Stockton LLP

(57) ABSTRACT

A semiconductor device includes an insulating layer on a semiconductor substrate, a bit line including TiAl and disposed on the insulating layer, a sidewall layer disposed on opposite sides of the bit line, a word line including TiN and disposed on the sidewall layer intersecting the bit line, and an air gap in an intersection region of the bit line and the word line. The thickness of the sidewall layer is larger than the thickness of the bit line. By having the TiAl bit line and TiN word line, the uniformity of the bit line and word line can be easily controlled to improve the performance of the semiconductor device.

6 Claims, 7 Drawing Sheets

ELECTROMECHANICAL NONVOLATILE MEMORY

CROSS-REFERENCES TO RELATED APPLICATIONS

This application claims priority to Chinese patent application No. 201410486979.8, filed Sep. 22, 2014, the content of which is incorporated herein by reference in its entirety.

BACKGROUND OF THE INVENTION

The present invention relates generally to integrated circuits and, more particularly to electromechanical memory devices and method for manufacturing such memory devices.

As mobile electronic products continue to include more memory devices, flash memory has become increasingly important in storing and retrieving data in the electronic products. With the continuous decrease in semiconductor technology process nodes, in particular for process nodes at 20 nm and below, there is a physical limit to the thickness of the tunnel dielectric layer.

3D integration technology can advantageously be employed in memory designs to increase storage capacity, a variety of cross-point memory arrays may be considered as a successor to flash memory.

FIGS. 1A through 1C illustrate cross-sectional views of a non-volatile electromechanical diode memory cell of the related art. FIG. 1A is a cross-sectional view illustrating an initial state of a conventional electromechanical diode memory cell. FIG. 1B is a cross-sectional view illustrating the programming principle of the conventional electromechanical diode memory cell. FIG. 1C is a cross-sectional view illustrating the reset principle of the conventional electromechanical diode memory cell.

As shown in FIG. 1A, the non-volatile electromechanical diode memory cell includes a bit line (BL) 101 intersecting a word line (WL) 102, and an air gap 103 separating the bit line from the word line. Bit line 101 is made of a low work function material including phosphorous-doped polycrystalline silicon (N-type), word line 102 is made of a high work function material including a boron-doped polycrystalline silicon (P-type). When the non-volatile electromechanical diode memory cell is not programmed, bit line 101 and word line 102 are separated by air gap 103 so that no current flows through the memory cell. In FIG. 1A, bit line 101 extends in a direction perpendicular to the surface of the paper, and word line 102 extends in a direction parallel to the surface of the paper.

During programming, a reverse-bias voltage pulse greater than the beam pull-in voltage is applied between word line 102 and bit line 101 to induce a pulling electrostatic force (indicated by arrow 110) so that word line 102 makes contact with bit line 101 at the intersection region and form a diode structure, as shown in FIG. 1B.

To reset the memory cell to the initial open-circuit state, a forward-bias voltage pulse is applied between word line 102 and bit line 101 to generate another (pushing) electrostatic force (indicated by arrow 112) to counteract the inherent electrostatic force of the diode structure, as shown in FIG. 1C. After applying the forward bias voltage pulse, the memory cell will return to the open-circuit state shown in FIG. 1A.

FIG. 2 is a configuration of a cross-point array of non-volatile electromechanical diode memory cells (also called a memory array or memory circuit). In the memory array shown in FIG. 2, the cross point of the WL' line and BL' line is selected, i.e., the memory cell in the dashed circle is selected. Therefore, the selected memory cell forms a diode, the remaining non-selected memory cells are in the open-circuit reset state. When the memory array is manufactured without any settings, the default state of all memory cells is the open-circuit reset state.

Conventional non-volatile electromechanical diode memory arrays are suitable for compact storage applications, and the relatively simple 3D integration process enables a wide range of applications. However, since bit line 101 includes a low work function material of phosphorous doped polycrystalline silicon (N-type), and the word line 102 is made of a high work function material of boron-doped polycrystalline silicon (P-type), the different work function materials make it difficult to control the uniformity of bit line 101 and word line 102, thereby affecting the device performance. Furthermore, the fabrication of bit line 101 and word line 102 require additional ion implantation processes, which may lower the production efficiency.

Thus, an improved electromechanical diode memory cell and a method of fabricating the same are desired.

BRIEF SUMMARY OF THE INVENTION

With the above description in mind, embodiments of the present invention provide an improved electromechanical diode memory cell and the method for manufacturing the same.

In an embodiment, a semiconductor device includes a semiconductor substrate, an insulating layer on the semiconductor substrate, a bit line including a TiAl material and disposed on the insulating layer, a sidewall layer disposed on opposite sides of the bit line, and a word line including a TiN material and disposed on the sidewall layer intersecting the bit line. The sidewall layer has a thickness larger than the thickness of the bit line. An intersection region of the word line and bit line form a memory cell.

In one embodiment, an air gap separates the intersection region of the bit line and the word line when the memory cell is not programmed.

In one embodiment, the word line makes contact with the bit line to form a diode structure when the memory cell is programmed.

In one embodiment, the semiconductor device further includes a high-k dielectric metal gate transistor, which includes a TiAl work function layer and a TiN work function layer, the TiAl work function layer is formed at the same time as the bit line is formed, and the TiN work function layer is formed at the same time as the word line is formed.

In one embodiment, the sidewall layer comprises silicon nitride.

Embodiments of the present invention also provide a method for manufacturing a semiconductor device. The method includes forming an insulating layer on a semiconductor substrate, forming a TiAl layer on the insulating layer, forming a sacrificial layer on the TiAl layer (S101), performing a first etching process to remove a portion of the sacrificial layer and a portion of the TiAl layer to form a bit line comprising a remaining portion of the TiAl layer and a remaining portion of the sacrificial layer (S102). The method also includes forming a dielectric layer on sidewalls of the bit line and a top surface of the remaining portion of the sacrificial layer, and performing a second etching process on the dielectric layer to form dielectric sidewalls on opposite sides of the bit line (S103). The method further includes forming a TiN layer on the top surface of the remaining portion of the sacrificial layer and on a top surface of the dielectric sidewalls, performing a third etching process on the TiN layer to form a word line intersecting the bit line (S104), and removing the remaining portion of the sacrificial layer (S105).

In one embodiment, the TiAl layer is formed by a physical vapor deposition process. The TiAl layer is formed at a same time as a TiAl work function layer is formed in a transistor region in the semiconductor substrate.

In one embodiment, the sacrificial layer includes polysilicon and has a thickness in a range between 10 nm and 100 nm.

In one embodiment, the first and third etching processes comprise reactive ion etching.

In one embodiment, the dielectric layer comprises silicon nitride and formed by a PECVD process.

In one embodiment, the TiN layer comprises an atomic layer deposition process and is formed at a same time as a TiN work function layer is formed in a transistor region in the semiconductor substrate.

In one embodiment, the sacrificial layer is removed by an isotropic wet etching process with an etching solution comprising $HNO_3$, $H_2O$, and HF, the molar ratio of the solution $HNO_3$:$H_2O$:HF is 50:20:1.

Embodiments of the present invention also provide an electronic device containing a semiconductor device and an electronic component connected with the semiconductor device, wherein the semiconductor device is the semiconductor device described above and manufactured by the above-described method.

The following description, together with the accompanying drawings, will provide a better understanding of the nature and advantages of the claimed invention.

DETAILED DESCRIPTION OF THE INVENTION

Figure 1A:
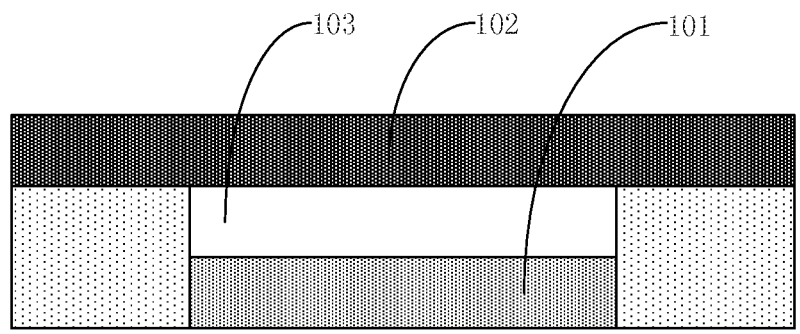
FIG. 1A is a cross-sectional view illustrating an initial state of a non-volatile electromechanical diode memory cell in the related art.
Figure 1B:
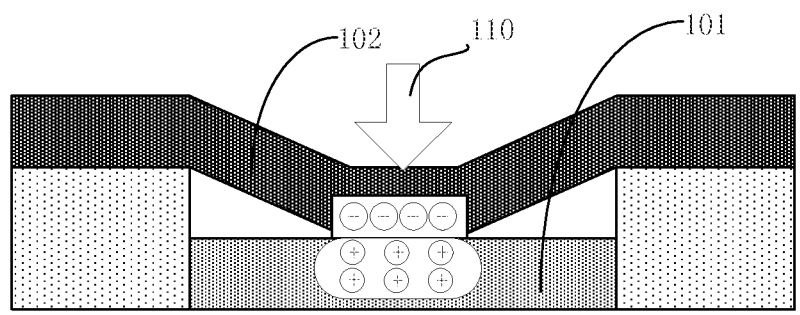
FIG. 1B is a cross-sectional view illustrating a programmed state of a non-volatile electromechanical diode memory cell in the related art.
Figure 1C:
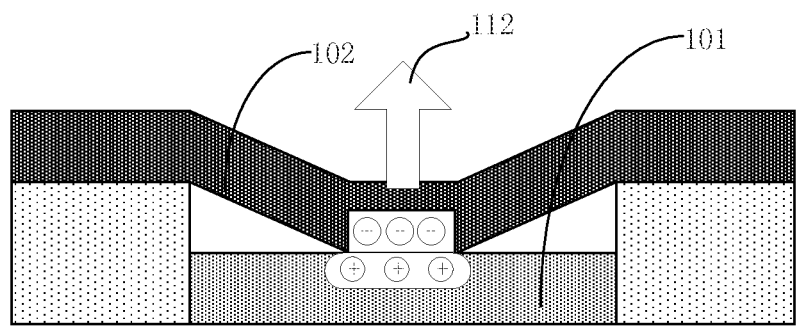
FIG. 1C is a cross-sectional view illustrating a reset state of a non-volatile electromechanical diode memory cell in the related art.
Figure 2:
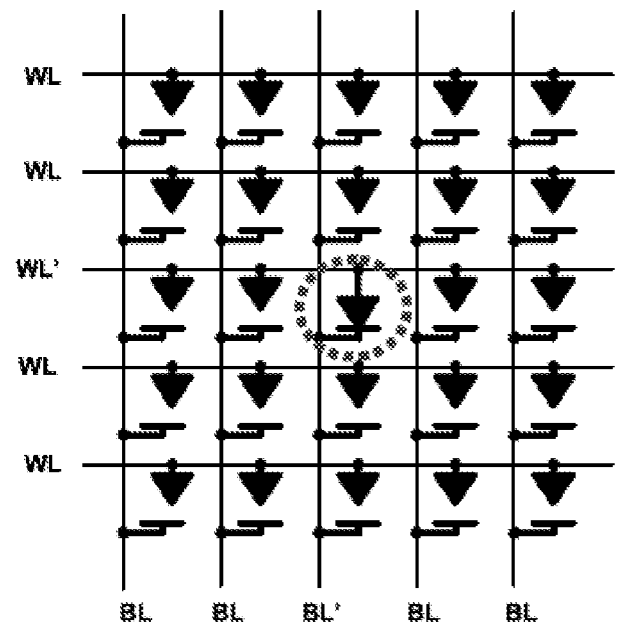
FIG. 2 is structural diagram of a cross-point array of non-volatile electromechanical diode memory cells showing a selected memory cell in the related art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, tier example, from manufacturing.

It will be understood that, when an element or layer is referred to as "on," "disposed on," "adjacent to," "connected to, or coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations and perspective views that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Embodiment 1

In accordance with the present invention, a semiconductor device is provided. The semiconductor device can be a non-volatile electromechanical memory device and may include a non-volatile memory device and other devices, such as high-k metal gate transistors and other active and/or passive electronic components.

Figure 3:
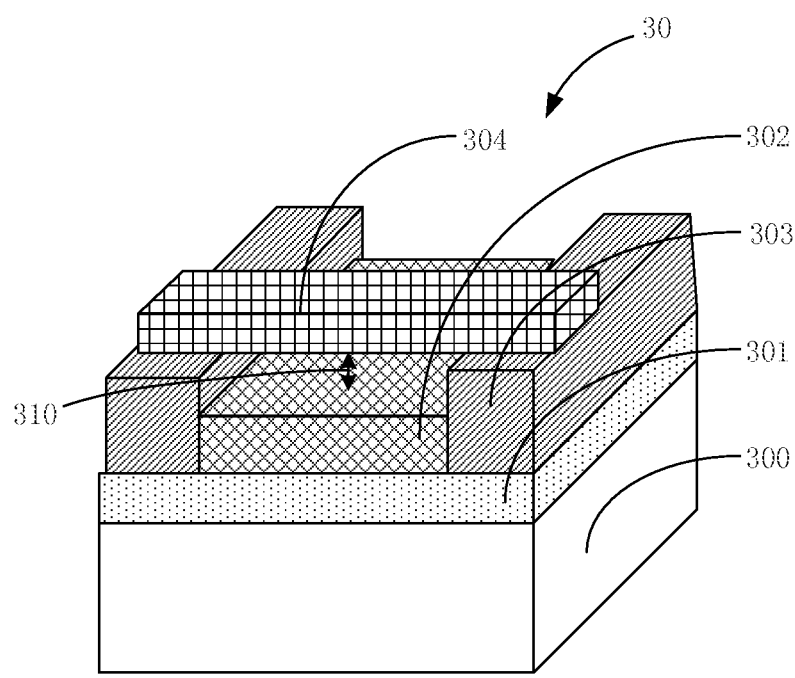
FIG. 3 is a perspective view of a non-volatile electromechanical diode memory cell according to an embodiment of the present invention.

FIG. 3 is a perspective view of a semiconductor device 30 according to an embodiment of the present invention. As shown, the semiconductor device includes a semiconductor substrate 300, an insulating layer 301 on semiconductor substrate 300, a sidewall layer 303 having a first side and second side on insulating layer 301, and a bit line (BL) 302 on insulating layer 301 and disposed between the first and second sides of sidewall layer 303. Semiconductor device 30 also includes a word line (WL) 304 disposed on the top surface of the first and second sides of sidewall layer 303 and intersecting bit line 302. Bit line 302 includes a TiAl material, and word line 304 includes a TiN material.

Since TiAl and TiN are of different types, their contact can form a PN junction structure.

In the embodiment, when a memory cell corresponding to the intersection region of bit line 302 and word line 304 is not programmed, bit line 302 and word line 304 are separated by an air gap 310.

The experiments showed that when an appropriate voltage was applied between bit line 302 and word line 304, a program operation could be completed to the corresponding memory cell, and word line 304 and bit line 302 would make a contact at the intersection region, thereby forming a diode structure. The specific programming principle of the semiconductor device has been described in the background section above and will not be repeated herein for the sake of brevity.

The semiconductor device may further include transistors or other devices, such as inductors, resistors, MEMS devices, etc. The transistors may be high-k metal gate transistors. In an exemplary embodiment, the gate electrode of the high-k metal gate transistors may include a work function of a TiAl layer and a work function of a TiN layer.

Additionally, in another exemplary embodiment, the work function TiAl work function layer of the high-k metal gate transistors and bit line 302 are formed in a same process. The work function TiN layer of the high-k metal gate transistors and the word line 304 are formed in a same process. In other words, the TiAl work function layer of the high-k metal gate transistors is formed at the same time as the bit line is formed, and the TiN work function layer of the high-k metal gate transistors is formed at the same time as the word line is formed.

In the embodiment, semiconductor substrate 300 may be a monocrystaline silicon substrate, a polycrystalline silicon substrate, a SOI substrate, or other suitable substrate. Insulating layer 301 may be silicon oxide or other suitable material. Sidewall layer 303 may be a silicon nitride or other suitable material.

In accordance with the present invention, bit line 302 and word line 304 are respectively TiAl and TiN with respect to doped silicon in the prior art, it is thus relatively easy to control the uniformity of the bit line and the word line, thereby improving the performance of the semiconductor device.

Furthermore, since the bit line and word line have the same materials as the work function materials of the high-k metal gate electrode, the manufacturing process of the semiconductor device is compatible with existing semiconductor manufacturing processes, no additional processes are required, and the production efficiency can be increased.

Embodiment 2

Figure 4A:
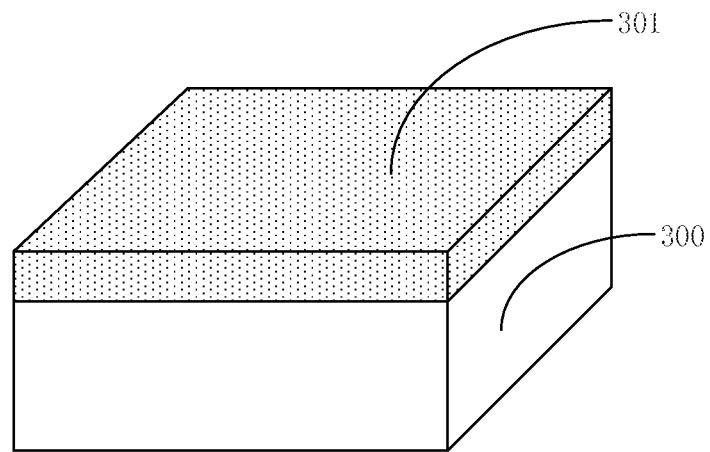
FIGS. 4A-4H are perspective views illustrating intermediate stages of a non-volatile electromechanical diode memory cell in a manufacturing method according to an embodiment of the present invention.
Figure 4B:
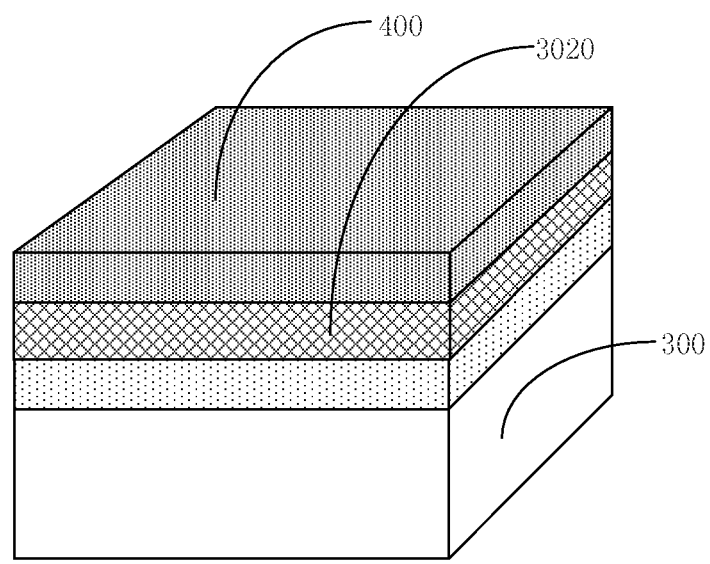
Figure 4C:
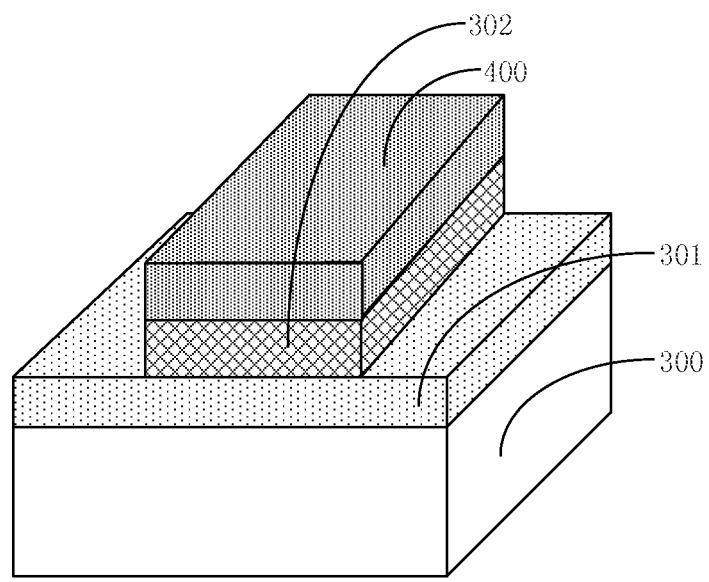
Figure 4D:
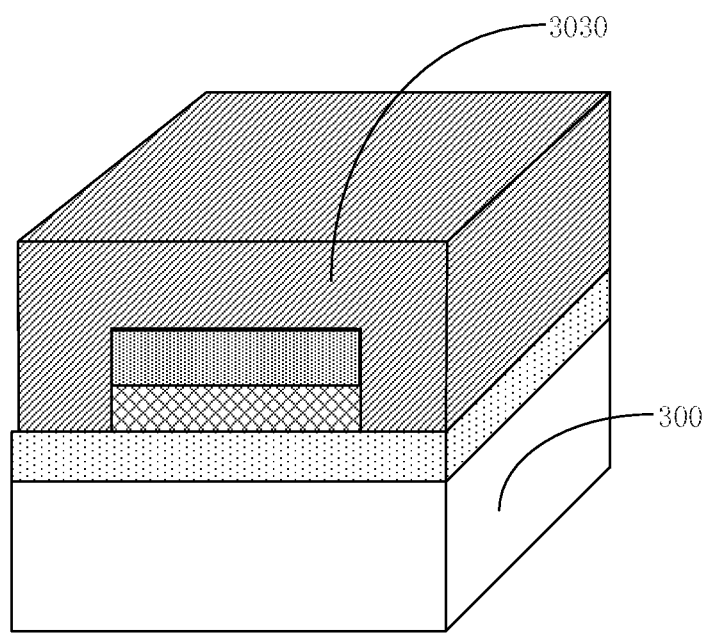
Figure 4E:
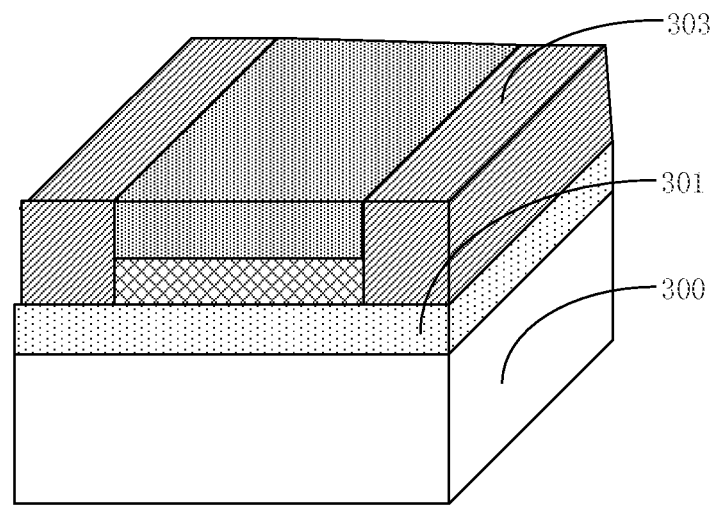
Figure 4F:
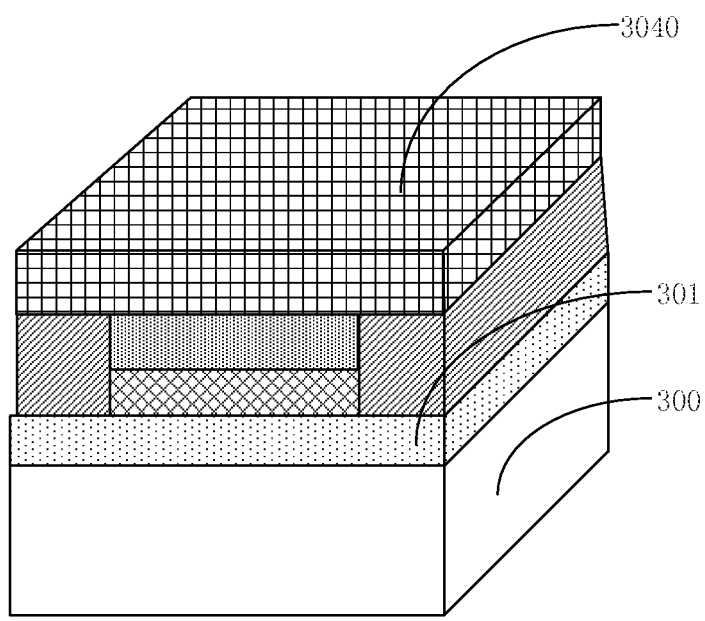
Figure 4G:
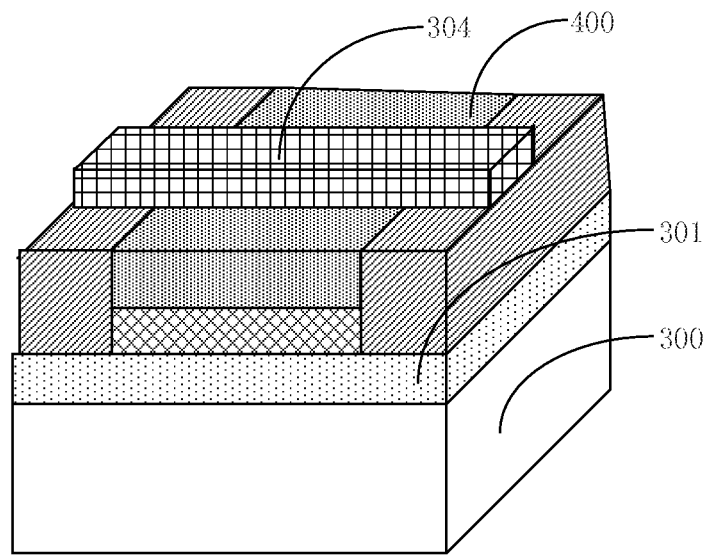
Figure 4H:
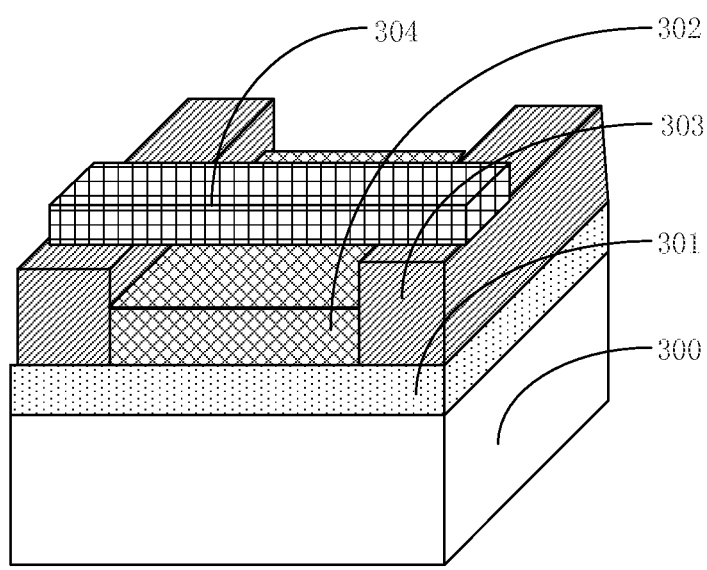
Figure 5:
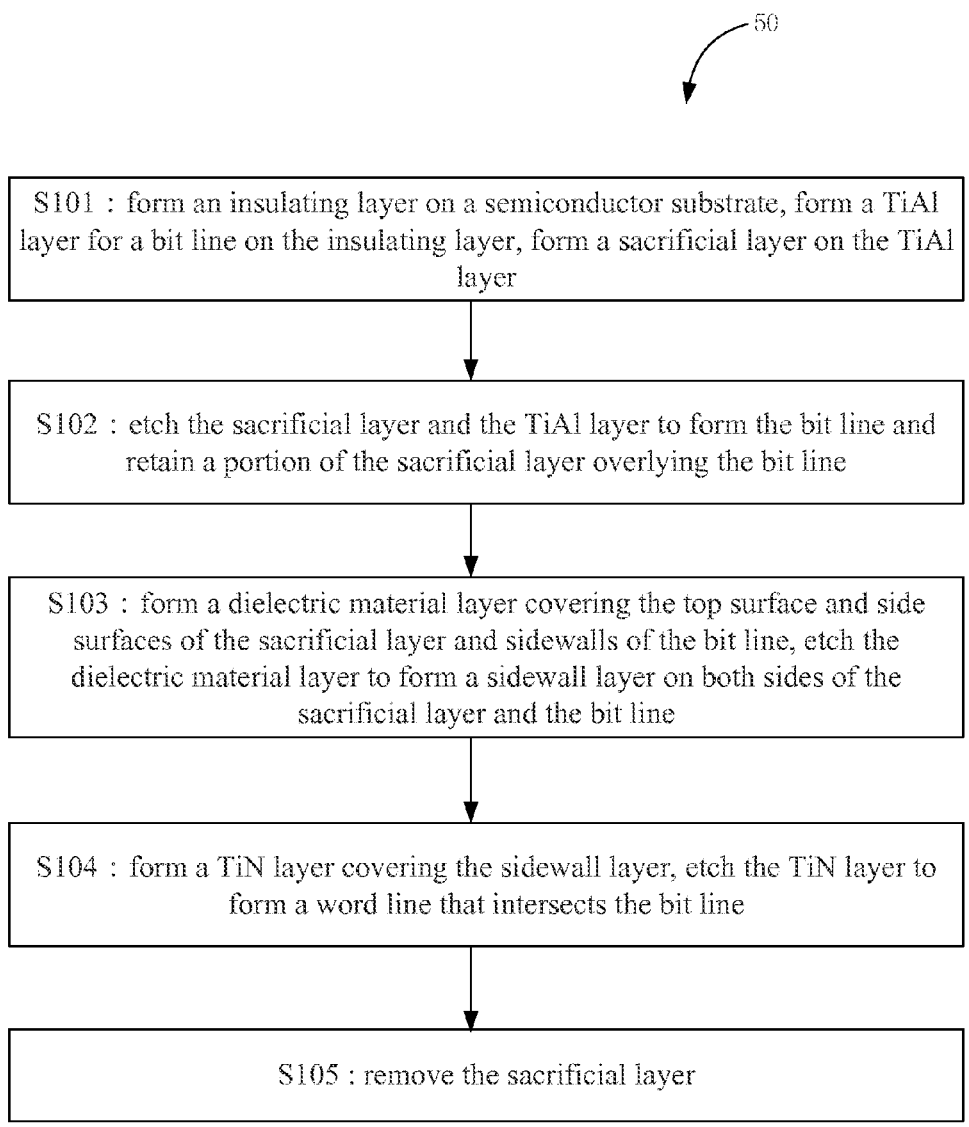
FIG. 5 is a simplified flow chart of a method for manufacturing a non-volatile electromechanical diode memory cell according to an embodiment of the present invention.

FIGS. 4A through 4H are simplified perspective views illustrating stages of process steps of forming a semiconductor device according to an embodiment of the present invention. FIG. 5 is a flow chart of a method for manufacturing a semiconductor device according to an embodiment of the present invention.

In an embodiment, the method may include the following steps:

A1: Provide a semiconductor substrate 300; form an insulating layer 301 on semiconductor substrate 300, as shown in FIG. 4A. Semiconductor substrate 300 may be a monocrystalline silicon substrate, polycrystalline silicon substrate, SOI substrate and other suitable substrate.

Insulating layer 301 may be silicon oxide and other suitable materials. Insulating layer 301 may be formed by a deposition process or other suitable processes.

A2: Form a bit line TiAl layer 3020 on insulating layer 301 and a sacrificial layer 400 on bit line TiAl layer 3020, as shown in FIG. 4B. TiAl layer 3020 may be formed using a physical vapor deposition (PVD) process or other suitable processes.

TiAl layer 3020 includes the same work function material as that of the conventional high-k metal gate transistor. In an exemplary embodiment, TiAl layer 3020 and transistors (not shown) in a region of semiconductor substrate 300 may include a work function TiAl material layer formed in the same process. This ensures that the method for manufacturing is compatible with conventional semiconductor manufacturing processes, TiAl layer can thus, be formed without any additional processes to improve production efficiency.

Sacrificial layer 400 may be formed by a deposition process and have a thickness in the range between 10 nm and 100 nm. Sacrificial layer 400 may be made of polysilicon or other suitable materials.

A3: Perform an etching process on TiAl layer 3020 to form a bit line 302, a portion of sacrificial layer 400 over bit line 302 remains after the etching process, as shown in FIG. 4C.

Prior to etching TiAl layer 3020, a selective etching process is performed on sacrificial layer 400 to remove portions of sacrificial layer 400 not covering bit line 302 to expose portions of TiAl layer 3020. Then the exposed portions of TiAl layer 3020 are etched away to form bit line 302, as shown in FIG. 4C.

In an embodiment, TiAl 3020 layer may be etched using a reactive ion etching (RIE) process or other suitable etching processes. Before etching sacrificial layer 400, a patterned photoresist layer may be formed on sacrificial layer 400. The patterned photoresist layer may be formed by a lithography process or other suitable processes.

A4: Form a dielectric material layer 3030 covering the top surface and sidewalls of sacrificial layer 400 and sidewalls of bit line 302, as shown in FIG. 4D. Perform an etching process on dielectric material layer 3030 to form a sidewall 303 disposed on opposite sides of sacrificial layer 303 and bit line 302, as shown in FIG. 4E.

Dielectric material layer 3030 may be silicon nitride or other suitable materials and may be formed by a plasma enhanced chemical vapor deposition (PECVD) process or other suitable deposition processes.

Dielectric material layer 3030 may be etched by a reactive ion etching process or other suitable processes.

A5: Form a TiN layer 3040 covering sacrificial layer 400 and sidewall layer 303, as shown in FIG. 4F. TiN layer 3040 may be formed by an atomic layer deposition (ALD) process or other suitable processes.

TiN layer 3040 includes the same work function material as that of the conventional high-k metal gate transistor. In an exemplary embodiment, TiN layer 3040 and transistors (not shown) in a region of semiconductor substrate 300 may include a work function TiN material layer formed in the same process. This ensures that the method for manufacturing is compatible with conventional semiconductor manufacturing processes, TiN layer can thus, be formed without any additional processes to improve production efficiency A6: Perform an etching process on TiN layer 3040 to form a word line 304, which intersect the bit lines disposed below, as shown in FIG. 4G.

In an embodiment, TiN layer 3040 can be etched by a reactive ion etching (RIE) process or other suitable etching processes.

A7: Remove sacrificial layer 400, as shown in FIG. 4H. Sacrificial layer 400 is removed by an isotropic wet etching process. In a specific embodiment, the wet etching process includes an etching solution including $HNO_3$, $H_2O$ and HF with the molar ratio of $HNO_3:H_2O:HF=50:20:1$. This molar ratio can ensures complete removal of the sacrificial layer.

The above process steps will complete the manufacturing method according to an embodiment of the present invention. Of course, the manufacturing method is not limited to the above-described process steps and may include other process steps, as known to those of skill in the art.

In accordance with the method for manufacturing a semiconductor device of the present invention, the bit line 302 and word line 304 are made of work function materials TiAl and TiN, respectively, the uniformity of the bit line and word line can be better controlled in relation to the use of doped polysilicon for the bit line and word line of the prior art, so that the performance of the semiconductor device can be improved.

Furthermore, since the bit line and word line are made of the same materials as the work function materials of the high-k metal gate process, the manufacturing method is compatible with existing semiconductor manufacturing processes of making high-k metal gate transistors, no additional processes are required, thereby improving the production efficiency.

FIG. 5 is a flow chart illustrating a method 50 for manufacturing a semiconductor device according to an embodiment of the present invention. Method 50 may include the following steps:

S101: Form an insulating layer on a semiconductor substrate; for a TiAl layer on the insulating layer; form a sacrificial layer on the TiAl layer;

S102: Perform an etching process to remove portions of the sacrificial layer and the TiAl layer to form a bit line including a remaining portion of the TiAl layer and a remaining portion of sacrificial layer over the remaining portion of the TiAl layer;

S103: Form a dielectric layer covering the top surface and sidewalls of the bit line, i.e., the top surface and the sidewalls of the remaining portion of sacrificial layer and the sidewalls of the remaining portion of the TiAl layer; perform an etching process on the dielectric layer to form dielectric sidewalls on opposite sides of the bit line;

S104: Form a TiN layer covering the top surface of the sacrificial layer and the top surface of the dielectric sidewalls; perform an etching process on the TiN layer to form a word line disposed in a transverse direction to the bit line;

S105: Remove the sacrificial layer.

Embodiment 3

Embodiments of the present invention provide an electronic device including a semiconductor device and electronic components connected to the semiconductor device. The semiconductor device is manufactured by the above-described method of embodiment 2 or the above-described semiconductor device structure of embodiment 1. The electronic components can be any active, passive, or discrete components.

In an embodiment, the electronic device may include a semiconductor substrate, an insulating layer on the semiconductor substrate, a bit line on the insulating layer, a sidewall layer disposed on opposite sidewalls of the bit line, and a word line on the sidewall layer and in a direction transversal to the bit line. In the embodiment, the sidewall layer has a thickness larger than the thickness of the bit line, so that an air gap is generated between the bit line and the word line. The bit line is made of a TiAl material, and the word line is made of a TiN material.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that are manufactured using the above-described method to have the above-described characteristics.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
   a semiconductor substrate;
   an insulating layer on the semiconductor substrate;
   a bit line comprising a TiAl material and disposed on the insulating layer;
   a sidewall layer disposed on opposite sides of the bit line; and
   a word line comprising a TiN material and disposed on the sidewall layer intersecting the bit line;
   wherein the sidewall layer has a thickness larger than the thickness of the bit line, and
   an intersection region of the word line and bit line forms a memory cell.

2. The semiconductor device of claim 1, wherein an air gap separates the intersection region of the bit line and the word line when the memory cell is not programmed.

3. The semiconductor device of claim 1, wherein the word line makes contact with the bit line to form a diode structure when the memory cell is programmed.

4. The semiconductor device of claim 1, further comprising a high-k dielectric metal gate transistor, the high-k dielectric metal gate transistor comprising a TiAl work function layer and a TiN work function layer, the TiAl work function layer being formed at the same time as the bit line is formed, and the TiN work function layer being formed at the same time as the word line is formed.

5. The semiconductor device of claim 1, wherein the sidewall layer comprises silicon nitride.

6. An electronic device comprising a semiconductor device and an electronic component connected with the semiconductor device, wherein the semiconductor device comprises:
   a semiconductor substrate;
   an insulating layer on the semiconductor substrate;
   a bit line comprising a TiAl material and disposed on the insulating layer;
   a sidewall layer disposed on opposite sides of the bit line; and
   a word line comprising a TiN material and disposed on the sidewall layer intersecting the bit line, wherein the sidewall layer has a thickness larger than the thickness of the bit line.

* * * * *